United States Patent [19]

Ovshinsky et al.

[11] Patent Number: 4,521,447
[45] Date of Patent: Jun. 4, 1985

[54] METHOD AND APPARATUS FOR MAKING LAYERED AMORPHOUS SEMICONDUCTOR ALLOYS USING MICROWAVE ENERGY

[75] Inventors: Stanford R. Ovshinsky, Bloomfield Hills; Stephen J. Hudgens, Southfield, both of Mich.; Marc A. Kastner, Newton Lower Falls, Mass.

[73] Assignee: Sovonics Solar Systems, Solon, Ohio

[21] Appl. No.: 565,033

[22] Filed: Dec. 23, 1983

Related U.S. Application Data

[62] Division of Ser. No. 435,068, Oct. 18, 1982, abandoned.

[51] Int. Cl.³ .......................... B05D 3/02; B05D 3/06; B05D 5/12
[52] U.S. Cl. .................................. 427/45.1; 136/258; 427/38; 427/39; 427/85; 427/86
[58] Field of Search ...................... 427/39, 38, 86, 85, 427/45.1; 136/258

[56] References Cited

U.S. PATENT DOCUMENTS 4,282,267 8/1981 Kuyel ................................ 427/95 X
4,379,943 4/1983 Yang et al. ........................ 427/39 X

FOREIGN PATENT DOCUMENTS 2033355 5/1980 United Kingdom .................. 427/39

OTHER PUBLICATIONS

Brodsky, M. H. et al., IBM Technical Disclosure Bulletin, vol 22, No. 8A, Jan. 1980.
C. Mailhiut et al., *Electrical and Compositional Heterogeneity of Amorphous Si:H Films*, Journal of Non-Crystalline Solids, 35 & 36, pp. 207–212, 1980.

Cohen, Charles, *Thin Si Films Can Form at Room Temperature*, Electronics, Nov. 3, 1981, pp. 82, 84.

Primary Examiner—Michael R. Lusignan

[57] ABSTRACT

An apparatus and process utilizes microwave energy for depositing amorphous alloy materials in layered form onto a receiving surface. The process results in materials having unique properties suitable for many applications including photovoltaic applications. The process includes the steps of providing at least one source of microwave energy, providing at least two reaction gases, each gas containing at least one alloying element to be deposited onto the receiving surface, and selectively exciting the reaction gases with microwave energy to create excited species containing the alloying elements to be deposited for depositing the alloys in alternating layers onto the receiving surface. For depositing alternating layers of silicon and germanium alloys, the reactions gases can include silane ($SiH_4$) or silicon tetrafluoride ($SiF_4$), and germane ($GeH_4$) or germanium tetrafluoride ($GeF_4$). In accordance with one disclosed embodiment, the reaction gases are excited separately with the excited species therefrom being sequentially introduced to the receiving surface for layered deposition. In accordance with another disclosed embodiment, the reaction gases are premixed to form a mixture and thereafter, the reaction gases are selectively excited in a plasma which is moved back and forth in the direction of flow of the reaction gas mixture to form selective excited species. Layered deposition results as a consequence of both the selective depletion of one alloying element bearing species from the gas mixture flow and from the motion of the plasma excitation zone relative to the receiving surface.

21 Claims, 5 Drawing Figures

METHOD AND APPARATUS FOR MAKING LAYERED AMORPHOUS SEMICONDUCTOR ALLOYS USING MICROWAVE ENERGY

This is a division of application Ser. No. 435,068 filed Oct. 18, 1982, now abandoned.

BACKGROUND OF THE INVENTION

This invention relates to an apparatus and method for making compositionally modulated amorphous alloys. The invention more particularly relates to a method of making amorphous semiconductor alloys in layered form from reaction gases excited by microwave energy. The invention has one important application in making improved photoresponsive alloys for photovoltaic cells such as tandem cells.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extermely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of the crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and or p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the silane deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

The prior deposition of amorphous silicon, which has been altered by hydrogen from the silane gas in an attempt to make it more closely resemble crystalline silicon and which has been doped in a manner like that of doping crystalline silicon, has characteristics which in all important respects are inferior to those of doped crystalline silicon. Thus, inadequate doping efficiencies and conductivity were achieved especially in the p-type material, and the photovoltaic qualities of these silicon alloy films left much to be desired.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a low density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

Amorphous semiconductor alloys made by the processes hereinabove described have demonstrated photoresponsive characteristic ideally suited for photovoltaic applications. These prior art processes however have suffered from relatively slow deposition rates and low utilization of the reaction gas feed stock which are important considerations from the standpoint of making photovoltaic devices from these materials on a commercial basis. In addition, these processes result in high electron temperature plasmas which produce, during deposition, high densities of ions. The production of these ions results in ion bombardment of the materials or they are being deposited which can result in material damage.

In order to overcome the aforementioned problems, a new and improved process for making amorphous semiconductor alloys and devices was recently discovered which utilized microwave energy to form a glow discharge plasma for the deposition of new and improved amorphous semiconductor alloys. Such a process is fully disclosed, for example, in copending application Ser. No. 423,424, filed Sept. 24, 1982, in the names of Stanford R. Ovshinsky, David D. Allred, Lee Walter, and Stephen J. Hudgens for Method of Making Amorphous Semiconductor Alloys and Devices Using Microwave Energy. The inventive process therein disclosed provides substantially increased deposition rates and reaction gas feed stock utilization. Further, the use of microwave energy results in depositions from plasmas with lower electron temperatures and substantially reduced ion densities and hence, substantially reduced ion bombardment and damage of the deposited materials. Still further, the process results in the formation of reactive species not previously obtainable in sufficiently large concentrations with prior processes. As a result, new amorphous semiconductor alloys can be produced having substantially different material properties than previously obtainable. All of the above results in amorphous semiconductor alloys and devices made therefrom having improved photoresponsive characteristics while being made at substantially increased rates.

Compositionally varied materials have been discovered which exhibit unique properties not found in strictly homogeneous materials. For example, such materials and methods for making the same are disclosed in copending application Ser. No. 422,155, filed Sept. 24, 1982, in the name of Stanford R. Ovshinsky for Compositionally Varied Materials And Method For Synthesizing The Materials. Also, U.S. Pat. No. 4,342,044 discloses a method and apparatus for making layered photovoltaic materials using radio frequency plasmas and free radical generators.

The present invention utilizes microwave energy for making compositionally modulated or varied amorphous materials.

More particularly, the invention provides the deposition of amorphous semiconductor alloy materials in layered form with the end result of capitalizing on the advantages of microwave energy deposition and the unique properties of compositionally modulated materials. As disclosed hereinafter, one use of such resulting materials is in a photovoltaic tandem cell wherein the material forms a new and improved narrow band gap intrinsic region having desirable photoresponsive and transport properties.

SUMMARY OF THE INVENTION

The present invention provides an apparatus and process for depositing amorphous alloy materials in layered form onto a receiving surface. The process of the present invention results in materials having unique properties suitable for many applications including photovoltaic applications.

In accordance with the invention, the process includes the steps of providing at least one source of microwave energy, providing at least two reaction gases, each gas containing at least one alloying element to be deposited onto the receiving surface, and selectively exciting the reaction gases with microwave energy to create excited species containing the alloying elements to be deposited for depositing the alloys in alternating layers onto the receiving surface. For depositing alternating layers of silicon and germanium alloys, the reactions gases can include silane ($SiH_4$), a silicon tetrafluoride ($SiF_4$), and germane ($GeH_4$) or germanium tetrafluoride ($GeF_4$). The reaction gases can be excited separately with the excited species therefrom being sequentially introduced to the receiving surface for layered deposition. Alternatively, the reaction gases can be premixed to form a mixture and thereafter, the reaction gases are selectively excited in a plasma which is moved back and forth in the direction of flow of the reaction gas mixture to form selective excited species. Layered deposition results as a consequence of both the selective depletion of one alloying element bearing species from the gas mixture flow and from the motion of the plasma excitation zone relative to the receiving surface.

DESCRIPTION OF THE PREFERRED EMBODIMENTS

Figure 1:
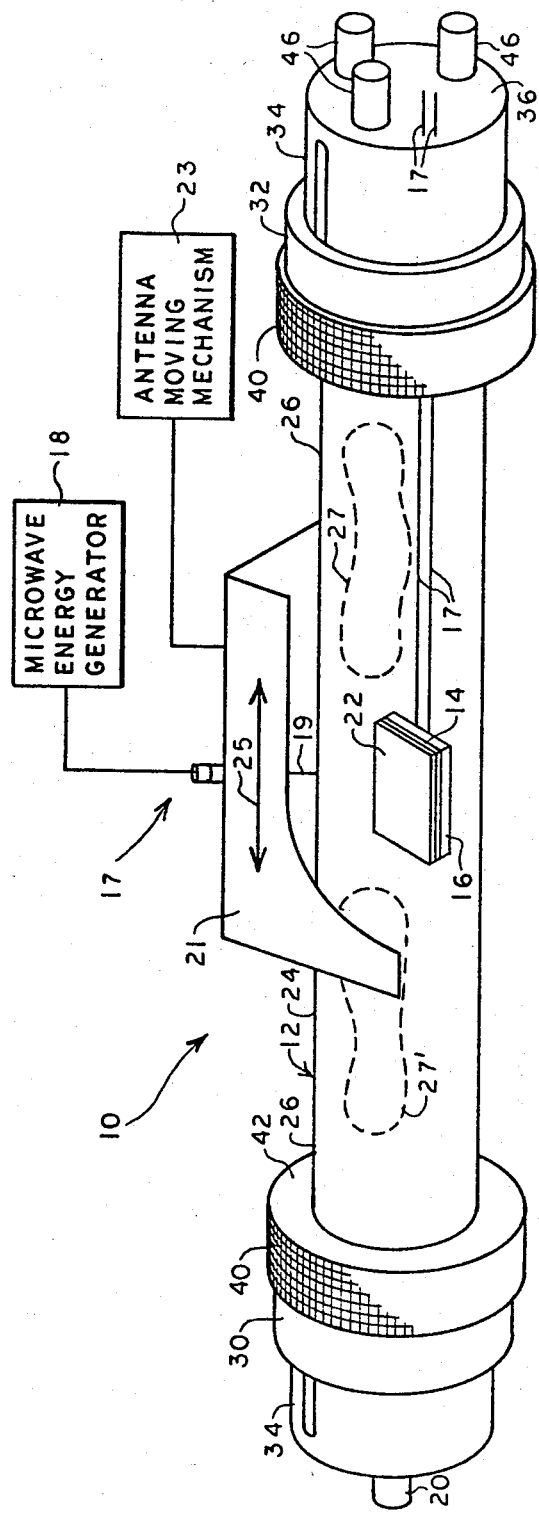
FIG. 1 is a perspective view, partly broken away, of a microwave plasma deposition system embodying the present invention for depositing amorphous semiconductor alloy films onto a receiving surface in layered form in accordance with the process of the invention.

Referring now more particularly to FIG. 1, a microwave deposition apparatus suitable for practicing the process of the present invention, is generally designated 10. The apparatus 10 comprises a transparent tubular chamber or vessel 12 containing a substrate 14 having a receiving surface upon which the amorphous semiconductor alloy films are to be deposited. The substrate is heated by a heater 16 and the exterior of the chamber is irradiated by a moveable microwave energy source 17. Reaction gases passing from inlets 46 to an outlet 20 at opposite ends of the chamber 12 receive microwave energy from the source 17. The combination of the reaction gases and the microwave energy from source 17 causes the formation of a plasma. As will be moe fully described hereinafter, as the source 17 is moved, the plasma also moves resulting in the deposition of a film 22 having a layered structure. In accordance with the present invention, the reaction gases include at least two reaction gases, each containing at least one alloying element to be deposited. The temperature of the substrate can be between room temperature and about 400 degrees Centigrade and the frequency of the microwave energy can be 2.45 Gigahertz and above and preferably 2.45 Gigahertz. As mentioned, the combined microwave energy and the reaction gases form the plasma and as the source 17 is moved, the reaction gases are selectively excited to permit the deposition process of the layered materials to proceed. During the process, the film 22 is spared from the damaging effects of ion bombardment because of the relatively low ion concentration in the plasma and reduced substrate self bias.

Referring now to FIG. 1 in greater detail, the tubular chamber 12 comprises a central quartz portion 24 and end portions 26 at opposite ends thereof. The end portions 26 are closed by a pair of end fittings 30 and 32 to complete the chamber. Each of the end fittings includes a sleeve portion 34 extending from a closed end 36 to an open end portion. The open end portion is threaded to receive a collar 40 having an inwardly extending annular flange 42 at one end thereof. An o-ring (not shown) is confined in a space between the flange 42 and the end portion for compression thereof against the quartz portion 26. An air-tight seal is provided in this way between the end fittings 30 and 32 and the tubular chamber 12.

The end fittings 30 and 32 are preferably made of stainless steel or other suitable noncorrosive metal, with the closed ends 36 being welded or otherwise permanently joined to the sleeve portions 34. The closed end 36 of the end fitting 32 is provided with gas inlets 46 through which the reaction gases are introduced into the vessel 12. An inert gas such as argon can be introduced through one inlet 46 to assist in sustaining the plasma.

The gas inlets 46 are preferably connected to a conventional gas rack (not shown) for establishing regulated flows of reaction gases therein. The outlet 20 is provided at the closed end 36 to the end fitting 30 for connection to selectable first and second pumps. The first pump provides for initial evacuation of the chamber. The second pump provides withdrawal of unused reaction gases during operation and maintenance of the proper deposition pressure of 0.1 Torr or greater.

The microwave energy source 17 preferably comprises a microwave energy generator 18 coupled to an antenna 19. The antenna 19 is housed within a reflective housing 21 for concentration of the microwave energy into the chamber 12. The reflective housing 21 is coupled to an antenna moving mechanism 23 adapted to move the housing 21 and antenna 19 back and forth in rectilinear movement as indicated by arrows 25. The movement of the antenna in turn causes the plasma to move from a first position indicated at 27 to a second position indicated as 27'. The movement of the plasma is in the direction of flow of the reaction gases which flow from the inlets 46 to the outlet 20. The antenna as illustrated is a vertical antenna being preferably one-quarter wavelength long. The tip of the antenna just touches the outer surface of the vessel 12 to maximize transmission of its output to the reaction gases.

The heater preferably comprises a conventional resistive heater contained within a substrate holder assembly 16. Power lines 17 for the heating element are passed through the closed end 36 of one of the end fittings.

In operation, the system 10 is first pumped down to below a desired deposition pressure, such as $10^{-5}$ Torr. The reaction gases such as silicon tetrafluoride ($SiF_4$), or silane ($SiH_4$), and germane ($GeH_4$) or germanium tetrafluoride are fed into the separate inlet conduits 46 and chamber 12 is brought up to the desired operating pressure of, for example, 0.1 Torr. To the foregoing reaction gases, hydrogen ($H_2$) can also be added.

The microwave energy from the antenna 19 is directed by the reflective housing 21 into the vessel 12 and the antenna 19 and housing 21 are moved as indicated to form a moving plasma over the substrate. Because the germanium containing gases ($GeH_4$ or $GeF_4$) have lower dissociation energies than the silicon containing gases ($SiH_4$ or $SiF_4$), they are selectively excited upon encountering the plasma zone resulting in a deposited amorphous semiconductor film which is initially germanium rich. As the gas mixture proceeds through the plasma zone and becomes more and more depleted of germanium containing excited species the remaining silicon containing excited species will result in the deposition of an amorphous semiconductor film which is silicon rich. With the antenna moving back and forth as indicated, the foregoing process continues resulting in alternating layers of amorphous germanium alloys and amorphous silicon alloys being deposited onto the substrate. Alternating layers of germanium rich and silicon rich alloys will result as long as the period of movement of the antenna 19 is long compared to the time necessary to deposit several atomic layers of the material. As a result, an amorphous semiconductor alloy film 22 is deposited onto the substrate 14 having the aforementioned layered structure. The heater 16 maintains the substrate at a temperature between about 20° Centigrade and 400° Centigrade. The output power of the microwave energy generator 18 is adjusted between about 0.1 to 1 watt per cubic centimeter in power density. The flow rate of the reaction gases can be between 1 to 10 SCCM for a two inch diameter reaction chamber 12. With the foregoing system parameters, deposition rates of 25 Å to 250 Å per second can be obtained.

Figure 3:
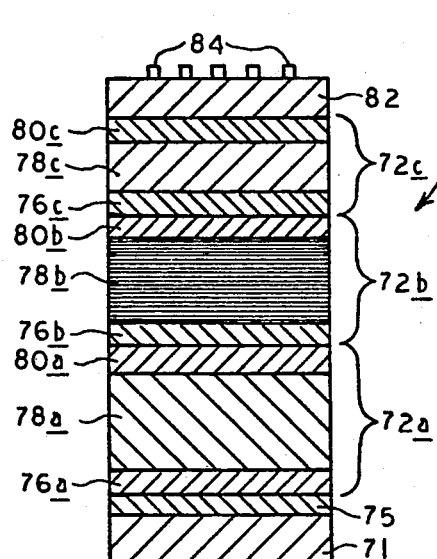
FIG. 3 is a sectional view of a tandem photovoltaic device which includes an intrinsic region comprising alternating layers of amorphous semiconductor alloys made by the process of the invention.

As will be illustrated in FIG. 3, the process of the invention can be used for making photovoltaic devices. The resulting layered material of alternating layers of amorphous germanium alloys and amorphous silicon alloys can be utilized as a narrow band gap region of a tandem photovoltaic cell. The other nonlayered intrinsic and doped regions of the device can be made by maintaining the antenna stationary and introducing appropriate reaction gases into the inlets 46. For intrinsic regions, the reaction gases can include germane ($GeH_4$), germanium tetrafluoride ($GeF_4$), silane ($SiH_4$) or silicon tetraflouride ($SiF_4$) and/or hydrogen. Also, these reaction gases can be combined depending upon desired properties. Also, band gap increasing elements such as nitrogen or carbon can be added in the form of ammonia gas ($NH_3$) or methane gas ($CH_4$) if a wide band gap is desired.

The doped regions can be formed by introducing dopants into the vessel 12 for making the deposited film either p-type or n-type. For example, diborane gas ($B_2H_6$) to make a p-type film or phosphine gas ($PH_3$) to make an n-type film can be introduced through one of the inlets 46. The reaction gases can be sequentially introduced to result in the formation of any desired device configuration.

Figure 2:
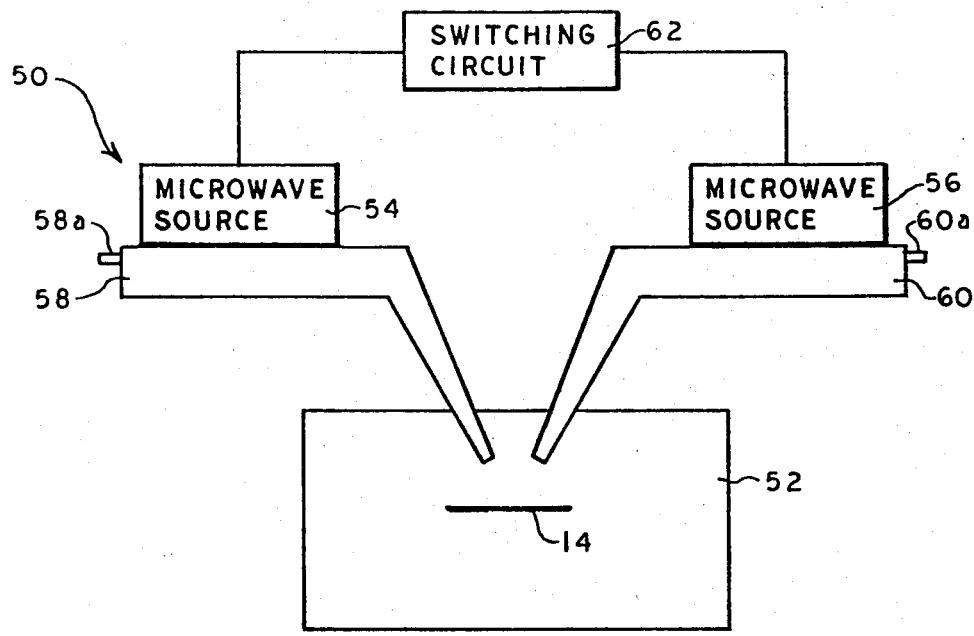
FIG. 2 is a schematic representation of another system embodying the present invention adapted for exciting the reactioon gases separately and sequentially introducing the excited species to the receiving surface for layered deposition.

Referring now to FIG. 2, it illustrates that the reaction gases can be separately excited and then the excited species therefrom sequentially introduced to the substrate for depositing alternating layers of amorphous alloys. The system 50 includes a substantially enclosed vessel or chamber 52 which contains the substrate 14 upon which the alloying elements are to be deposited in layered form. The system 50 further includes a pair of microwave energy sources 54 and 56, a corresponding pair of "Woods horns" 58 and 60, and a switching circuit 62. The Woods horns 58 and 60 each includes an inlet 58a and 60a respectively through which reaction gases can be fed.

Reaction gases, such as germanium tetrafluoride ($GeF_4$) or germane ($GeH_4$) can be fed into inlet 60a and reaction gases such as silicon tetrafluoride ($SiF_4$) or silane ($SiH_4$) can be fed into inlet 58a of horn 58 at flow rates of, for example, 15 sccm. The reaction gases are selectively excited by the selected actuation of the microwave sources 56 and 54. The pressure within the chamber 52 is maintained below the pressure within the Woods horns 58 and 60.

In operation, one of the microwave sources, for example, source 56 is actuated. The microwave energy therefrom excites the reaction gas therein, such as germane to create germanium excited species which travel down the horn and strike the substrate 14 to deposit thereon a layer of amorphous germanium alloy. Immediately thereafter, the other source 54 is actuated to selectively and separately excite the reaction gas, such as silane ($SiH_4$) in horn 58 to cause a layer of amorphous silicon alloy to be deposited over the layer of amorphous germanium alloy. This process continues until enough alternating layers are deposited to provide a film of desired thickness. While alternative layers of amorphous silicon and germanium alloys are disclosed herein, it can be appreciated that any other alloying elements in gaseous form can also be deposited by using microwave energy in accordance with the present invention.

Referring now to FIG. 3, it illustrates how the process of the present invention can be used in making a tandem photovoltaic cell, formed of a plurality of successive p-i-n regions including an amorphous semiconductor alloy and at least one region including a layered structure in accordance with the present invention.

The tandem photovoltaic device 70 includes a plurality of individual p-i-n type cells 72a, 72b, and 72c. Below the lowermost cell 72a is a substrate 71 which may be formed from a metallic material such as stainless steel, aluminum, tantalum, molybdenum, or chrome. The substrate 71 of the device 70 illustrated in FIG. 3 includes a specular reflector 75. The specular reflector 75 is formed from a reflective material by vapor depositing silver, gold, copper, chromium, molybdenum, or aluminum, for example, over the substrate 71. This form of reflector reflects light not absorbed during the initial pass through the active regions of the device back through the device and provides one additional pass therethrough. Since amorphous silicon or germanium alloys are good light absorbers, the one additional pass of the unabsorbed light through the device provides a significant increase in short circuit current and device efficiency.

Each of the cells 72a, 72b and 72c includes an n-type conductivity region 80a, 80b and 80c; an intrinsic region 78a, 78b and 78c; and a p-type conductivity region 76a, 76b and 76c. Although p-i-n cells are illustrated, the present invention also pertains to multiple n-i-p cells as well.

It is to be understood that following the deposition of the semiconductor alloy layers, a further deposition process may be either performed in a separate environment or as a part of a continuous process. In this step, a TCO (transparent conductive oxide) layer 82 is added. An electrode grid 84 may be added to the device where the cell is of a sufficiently large area, or if the conductivity of the TCO layer 82 is insufficient. The grid 84 shortens the carrier path and increases the collection efficiency.

All of the amorphous semiconductor alloy regions, except region 78b, of the device 70 of FIG. 3 can be formed by usng the apparatus of FIG. 1 while maintaining the antenna 19 in a stationary position over the substrate. The region 78b however is an improved structure of alternating amorphous silicon and germanium alloys formed in the manner previously described with respect to FIG. 1. This structure combines the high transport properties of amorphous silicon alloys with the high photon absorption properties of amorphous germanium alloys. Amorphous germanium alloys have a narrower band gap (about 1.1 eV) than amorphous silicon alloys (about 1.9 eV) but amorphous silicon alloys have shown to have a lower density of states than amorphous germanium alloys, and hence superior electrical transport properties.

The layers of the alternating amorphous germanium and silicon alloys can be made thin enough so that the amorphous germanium alloy layers can be utilized to absorb most of the photons for producing change carrier pairs and the amorphous silicon alloy layers can be utilized to effect transport of the charge carriers for efficient collection. Also, because the layers are thin, the entire region 78b can present a composite band gap between the extremes of 1.1 eV for amorphous germanium and 1.9 eV for amorphous silicon. This composite band gap is particularly appropriate for using such a layered structure as illustrated for the intrinsic region of the intermediate cell of a three cell tandem.

Figure 4:
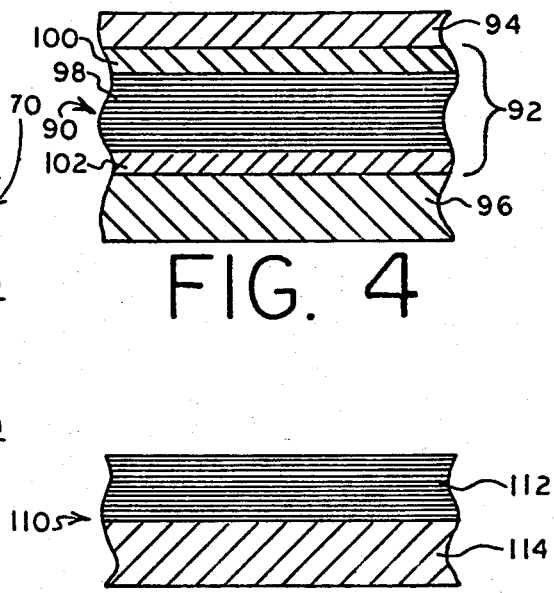
FIG. 4 is a fragmentary sectional view of a photodetection device which includes a layered amorphous semiconductor alloy region made by the process of the invention.

Referring now to FIG. 4, there is illustrated another application of a layered amorphous semiconductor alloy region utilized in a photodetector device 90 whose resistance varies with the amount of light impinging thereon. An amorphous alloy body 92 thereof is deposited in accordance with the invention, has no p-n junctions and is located between a transparent electrode 94 and a substrate electrode 96. In a photo-detector device it is desirable to have a minimum dark conductivity and so the amorphous alloy body 92 has an undoped layered region 98 and doped non-layered regions 100 and 102 of the same conductivity type chosen to form a low resistance contact with the substrate 96 and the top electrode 94. The layered region 98 preferably includes alternating layers of germanium and silicon amorphous alloys prepared by the methods previously described.

Figure 5:
FIG. 5 is a fragmentary sectional view of a xerographic drum including a layered amorphous semiconductor alloy region made by the process of the invention.

Referring to FIG. 5 an electrostatic image producing device 110 (like a xerography drum) is illustrated. The device 110 has a low dark conductivity, selective wavelength threshold, undoped or slightly p-doped amorphous oxygen stabilized layered amorphous semiconductor alloy region 112 deposited on a suitable substrate 114 such as a drum or belt. Again, the layered region 112 preferably includes alternating layers of amorphous silicon and germanium alloys prepared by the methods previously described. Small amounts of oxygen can be introduced into one or more of the layers by mixing small amounts of oxygen with the reaction gases.

The alloy regions other than the intrinsic alloy regions can be other than amorphous regions, such as polycrystalline regions. (By the term "amorphous" is meant an alloy or material which has long range disorder, although it may have short or intermediate order or even contain at times some crystalline inclusions.)

Modifications and variations of the present invention are possible in light of the above teachings. It is therefore, to be understood that within the scope of the appended claims the invention may be practiced otherwise than as specifically described.

What is claimed and desired to be secured by Letters Patent of the United States is:

1. A process for depositing amorphous alloy materials in layered form onto a receiving surface comprising:
   providing at least one source of microwave energy;
   providing at least two reaction bases, each said gas containing at least one alloying element to be deposited onto said receiving surface;

selectively exciting said reaction gases with said microwave energy to create from said reaction gases sequentially excited species containing said alloying elements to be deposited to form at least one region or layer of amorphous alloy material; and
depositing said alloy in a plurality of alternating sublayers onto said receiving surface to form said amorphous alloy material region.

2. A process as defined in claim 1 wherein said step of selectively exciting said reaction gases includes separately exciting said reaction gases and sequentially introducing said excited species onto said receiving surface.

3. A process as defined in claim 2 comprising the further steps of providing a pair of microwave energy sources and exciting each said reaction gas with a respective one of said microwave sources.

4. A process as defined in claim 1 wherein each said reaction gas is a reaction gas mixture.

5. A process as defined in claim 1 comprising the further steps of forming a mixture of said reaction gases, flowing said gas mixture over said receiving surface, creating a plasma by coupling said microwave energy into said reaction gas mixture, and moving said plasma in the direction of flow of said gas mixture for selectively creating said excited species and depositing said alloying elements onto said receiving surface in layered form.

6. A process as defined in claim 5 wherein said reaction gases have different dissociation energies.

7. A process as defined in claim 5 comprising the further steps of providing said microwave energy source with an antenna for coupling said microwave energy into said reaction gas mixture, and moving said antenna with respect to said receiving surface along the direction of said gas mixture flow for moving said plasma.

8. A process as defined in claim 5 wherein said plasma is moved rectilinearly and wherein the period of said plasma movement is long compared to the time required to deposit several atomic layers of the alloy materials.

9. A process as defined in claim 1 where said reaction gases include semiconductor containing compounds.

10. A process as defined in claim 9 wherein at least one of said reaction gases includes silicon.

11. A process as defined in claim 10 wherein said at least one reaction gas is silane ($SiH_4$) or silicon tetrafluoride ($SiF_4$).

12. A process as defined in claim 9 wherein at least one of said reaction gases includes germanium.

13. A process as defined in claim 12 wherein said at least one reaction gas is germane ($GeH_4$) or germanium tetrafluoride ($GeF_4$).

14. A process as defined in claim 1 wherein said reaction gases include silicon and germanium, and wherein alternating sublayers of amorphous silicon and amorphous germanium alloys are deposited onto said receiving surface.

15. A process as defined in claim 14 including forming said germanium alloy sublayers to absorb photons and produce charge carrier pairs and forming said silicon alloy sublayers to effect transport of the charge carriers for efficient charge collection.

16. A process as defined in claim 14 including forming said alternating alloy sublayers to include at least one density of states reducing element, said element being fluorine.

17. A process as defined in claim 14 including forming said alternating alloy sublayers to include at least one density of states reducing element, said element being hydrogen.

18. A process as defined in claim 1 including forming a plurality of alternating amorphous semiconductor alloy layers, forming alternating alloy layers from at least two different semiconductor alloys having a different band gap from one another, and forming a bulk composite material from said plurality of sublayers having a composite band gap intermediate the band gaps of said different alloy sublayers.

19. A process as defined in claim 18 including forming said bulk composite materials with greater than two sets of alternating alloy sublayers.

20. A process as defined in claim 18 including forming at least one of said alternating sublayers from an amorphous silicon alloy.

21. A process as defined in claim 18 including forming at least one of said alternating sublayers from an amorphous germanium alloy.

* * * * *